United States Patent
Yoo et al.

(10) Patent No.: US 8,383,467 B2
(45) Date of Patent: Feb. 26, 2013

(54) THIN FILM TRANSISTOR AND METHOD OF MANUFACTURING THE SAME

(75) Inventors: Byung-wook Yoo, Yongin-si (KR); Sang-yoon Lee, Seoul (KR); Myung-kwan Ryu, Yongin-si (KR); Tae-sang Kim, Seoul (KR); Jang-yeon Kwon, Seongnam-si (KR); Kyung-bae Park, Seoul (KR); Kyung-seok Son, Seoul (KR); Ji-sim Jung, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/564,082

(22) Filed: Aug. 1, 2012

(65) Prior Publication Data

US 2012/0295407 A1 Nov. 22, 2012

Related U.S. Application Data

(62) Division of application No. 12/453,295, filed on May 6, 2009, now Pat. No. 8,263,978.

(30) Foreign Application Priority Data

Sep. 24, 2008 (KR) ........................ 10-2008-0093862

(51) Int. Cl.
*H01L 21/00* (2006.01)
*H01L 21/84* (2006.01)

(52) U.S. Cl. .................. 438/149; 438/151; 257/E21.32; 257/E21.561

(58) Field of Classification Search .................. 438/149, 438/150, 151; 257/E21.32, E21.561, E21.7
See application file for complete search history.

(56) References Cited

U.S. PATENT DOCUMENTS

| 7,923,316 B2 | 4/2011 | Park et al. | |
|---|---|---|---|
| 2007/0114533 A1* | 5/2007 | Luo et al. | 257/61 |
| 2008/0258140 A1 | 10/2008 | Lee et al. | |

FOREIGN PATENT DOCUMENTS

| KR | 1020050016960 A | 2/2005 |
|---|---|---|
| KR | 1020060015183 A | 2/2006 |

* cited by examiner

*Primary Examiner* — Hoai V Pham
(74) *Attorney, Agent, or Firm* — Harness, Dickey & Pierce, P.L.C.

(57) ABSTRACT

A thin film transistor (TFT) and a method of manufacturing the same are provided, the TFT including a gate insulating layer on a gate. A channel may be formed on a portion of the gate insulating layer corresponding to the gate. A metal material may be formed on a surface of the channel. The metal material crystallizes the channel. A source and a drain may contact side surfaces of the channel.

12 Claims, 4 Drawing Sheets

THIN FILM TRANSISTOR AND METHOD OF MANUFACTURING THE SAME

PRIORITY STATEMENT

This application is a divisional application of U.S. application Ser. No. 12/453,295 now U.S. Pat. No. 8,263,978, now allowed, which claims the benefit of priority under 35 U.S.C. §119 from Korean patent application No. 10-2008-0093862, filed on Sep. 24, 2008, in the Korean Intellectual Property Office, the disclosure of each of which is incorporated herein by reference in their entirety.

BACKGROUND

1. Field

Example embodiments relate to a thin film transistor (TFT) and a method of manufacturing the same. Other example embodiments relate to a TFT that reduces leakage current, off current and/or contact resistance and a method of manufacturing the same. Yet other example embodiments relate to a TFT that may be used for a large-area high-resolution display device and a method of manufacturing the same.

2. Description of the Related Art

Thin film transistors (TFTs) may be used in various fields. For example, TFTs may be used as switching and driving elements in display applications and/or used as select switches for cross-point memory devices.

Liquid crystal displays (LCDs) are generally used as panels for televisions (TVs), although research is being conducted regarding the application of organic light emitting diodes (OLEDs) to TVs. Effort is directed toward the development of display devices for TVs that meet the demands of the market. The demands include larger area TVs or digital information displays (DIDs), lower prices and/or higher quality in features such as moving picture display, resolution, brightness, contrast ratio, color reproduction and the like. In order to meet the demands, TFTs, which can be used as switching and driving elements for large-area and high-performance display devices, may be necessary.

Amorphous silicon (a-Si) TFTs are generally used as driving and switching elements for display devices because the a-Si TFTs may be uniformly formed on a large substrate having a size of 2-m or more at a substantially low cost. As display devices are developed to be larger and to have higher quality, driving and switching elements that have a higher performance may be necessary. Because a-Si TFTs have a low mobility of about 0.5 cm2/Vs, there are limits to increasing the performance of the a-Si TFTs. As such, there is a demand for high-performance TFTs having a mobility higher than that of the a-Si TFTS and a method of manufacturing the high-performance TFTs.

Because polysilicon (poly-Si) TFTs may have a mobility of tens to hundreds of cm2/Vs and may be have a higher performance than a-Si TFTs, the poly-Si TFTs may be applied to high-quality display devices in terms of performance, unlike the a-Si TFTs. Also, poly-Si TFTs do not undergo as much characteristic deterioration as the a-Si TFTs.

It may be difficult to apply poly-Si TFTs to large substrates due to a complex manufacturing process and the inability to ensure uniform laser crystallization if polysilicon is formed. Excimer laser annealing is used as a low temperature method of manufacturing high-mobility poly-Si TFTs. However, laser equipment is expensive and there are limits to applying poly-Si TFTs to a large substrate using excimer laser annealing.

A super grain poly-Si (SGS) method has been used. The SGS method has substantially high quality and substantially high speed crystallization, as well as lower costs. The SGS method is difficult to stably drive TFTs due to substantially high leakage current and substantially high off current.

SUMMARY

Example embodiments relate to a thin film transistor (TFT) and a method of manufacturing the same. Other example embodiments relate to a TFT that reduces leakage current, off current and/or contact resistance and a method of manufacturing the same. Yet other example embodiments relate to a TFT that may be used for a large-area high-resolution display device and a method of manufacturing the same.

Example embodiments include a thin film transistor (TFT) having substantially low leakage current, substantially low off current and/or more stable operation, and a method of manufacturing the same.

Example embodiments include a TFT including a gate, a gate insulating layer formed on the gate, a channel formed on a portion of the gate insulating layer corresponding to the gate, a metal material formed on a surface of the channel to crystallize the channel, and a source and a drain contacting both (or opposing) side surfaces of the channel. The channel may be crystallized.

The metal material may be formed on the surface of the channel between the channel and the source, and between the channel and the drain. The channel may be formed of polysilicon.

The TFT may include an intermediate layer formed to reduce a contact resistance between the channel and the source and between the channel and the drain.

The metal material may include at least one selected from the group consisting of nickel (Ni), silver (Ag), gold (Au), palladium (Pd), cobalt (Co), copper (Cu), iron (Fe), aluminum (Al), chromium (Cr), platinum (Pt) and combinations thereof. The metal material may have a thickness of about 0.1 nm to 20 nm.

Example embodiments include a method of manufacturing an oxide TFT. The method may include forming a gate on a substrate and forming a gate insulating layer on the substrate and the gate. A metal material may be deposited on the gate insulating layer. A channel material may be coated on the metal material. An annealing process may be performed to form a channel. A conductive material may be coated on the channel. The coated conductive material may be etched until a surface of the channel is exposed.

Additional aspects will be set forth in part in the description which follows and, in part, will be apparent from the description, or may be learned by practice of the invention.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
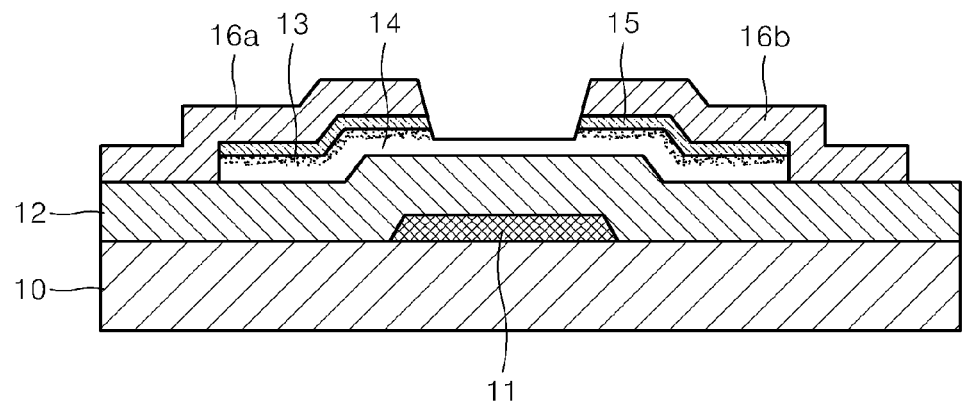
FIG. 1 is a cross-sectional view of a thin film transistor (TFT) according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a thin film transistor (TFT) and a method of manufacturing the same. Other example embodiments relate to a TFT that reduces leakage current, off current and/or contact resistance and a method of manufacturing the same. Yet other example embodiments relate to a TFT that may be used for a large-area high-resolution display device and a method of manufacturing the same.

Thin film transistors (TFTs) according to example embodiments may be used as driving transistors for various display devices (e.g., a liquid crystal display (LCD)) and an organic light emitting diode (OLED). Thin film transistors (TFTs) according to example embodiments may be used as select transistors or transistors constituting a peripheral circuit of a memory device.

FIG. 1 is a cross-sectional view of a TFT according to example embodiments. The TFT shown in FIG. 1 is a bottom gate TFT. A bottom gate TFT as shown in FIG. 1 is more cost effective than a top gate TFT because the bottom gate TFT is manufactured in a less number of processes.

Referring to FIG. 1, a gate 11 is formed on a portion of a substrate 10. If the substrate 10 is formed of silicon, an oxide layer (not shown) may be formed on a surface of the substrate 10 by thermal oxidation. A gate insulating layer 12 may be formed on the substrate 10 and the gate 11. A channel 14 may be formed on a portion of the gate insulating layer 12 corresponding to the gate 11. The channel 14 may be formed over the gate 11. A metal material 13 for crystallizing the channel 14 remains on (or within) a surface of the channel 14. A source 16a and a drain 16b are formed on both (or opposing) side surfaces of the channel 14. The metal material 13 may be formed on the surface of the channel between the channel 14 and the source 16a and between the channel 14 and the drain 16b. An intermediate layer 15 may be optionally formed between the channel 14 and the source 16a and between the channel 14 and the drain 16b.

The metal material 13 may be formed on a portion of the channel 14 wherein the channel 14 and the source 16a overlap and on a portion of the channel 14 wherein the channel 14 and the drain 16b overlap.

Materials used to form each layer of the TFT of FIG. 1 will now be explained.

The substrate 10 may be a substrate commonly used in a semiconductor device. For example, the substrate 10 may be formed of silicon, glass or organic material. Silicon oxide (SiO$_2$) may be formed on the surface of the substrate 11 by thermal oxidation.

The gate 11 is formed of a conductive material. For example, the gate 11 may be formed of a metal (e.g., titanium (Ti), platinum (Pt), ruthenium (Ru), gold (Au), silver (Ag), molybdenum (Mo), aluminum (Al), tungsten (W), copper (Cu) or combinations thereof), or a metal or conductive oxide (e.g., InZnO (IZO), AlZnO (AZO) or combinations thereof).

The gate insulating layer 12 may be formed of an insulating material well-known in the art for use in a semiconductor device. For example, the gate insulating layer 12 may be formed of SiO$_2$, hafnium oxide (HfO$_2$) (which is a higher-k material than SiO$_2$), aluminum oxide (Al$_2$O$_3$), silicon nitride (Si$_3$N$_4$) or a combination thereof.

The channel 14 may be formed of polysilicon. The metal material 13 remaining on the surface of the channel 14 to crystallize the channel 14 may include nickel (Ni). Instead of Ni, the metal material 13 may include any metal that can form a silicon silicide (e.g., silver (Ag), gold (Au), palladium (Pd), cobalt (Co), copper (Cu), iron (Fe), aluminum (Al), chromium (Cr), platinum (Pt) or combinations thereof).

The intermediate layer 15, which reduces a contact resistance between the channel 14 and the source 16a and between the channel 14 and the drain 16b, may be formed of n-type amorphous silicon.

Each of the source 16a and the drain 16b may be formed of a conductive material. For example, each of the source 16a and the drain 16b may be formed of a metal (e.g., Ti, Pt, Ru, Au, Ag, Mo, Al, W, Cu or combinations thereof), or a metal or conductive oxide (e.g., IZO, AZO or combinations thereof).

A method of manufacturing the TFT of FIG. 1 will now be explained with reference to FIGS. 2A through 2H.

FIGS. 2A through 2H are cross-sectional views illustrating a method of manufacturing the TFT of FIG. 1 according to example embodiments.

Figure 2A:
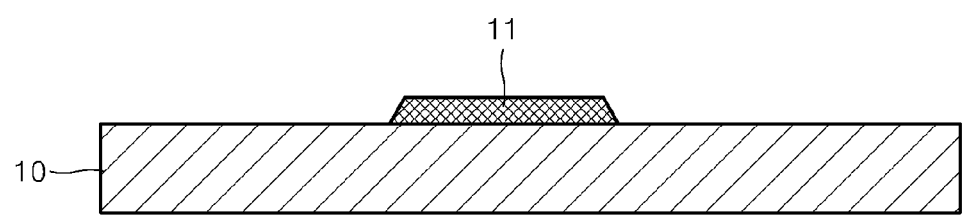
FIGS. 2A through 2H are cross-sectional views illustrating a method of manufacturing the TFT of FIG. 1 according to example embodiments.

Referring to FIG. 2A, the substrate 10 is prepared. The substrate 10 may be formed of silicon, glass or organic material. If the substrate 10 is formed of silicon, an insulating layer (e.g., an insulating layer formed of SiO$_2$) may be formed on a surface of the substrate 10 by thermal oxidation. A conductive material (e.g., a metal or a conductive metal oxide) is coated on the substrate 10 and patterned to form the gate 11.

Figure 2B:
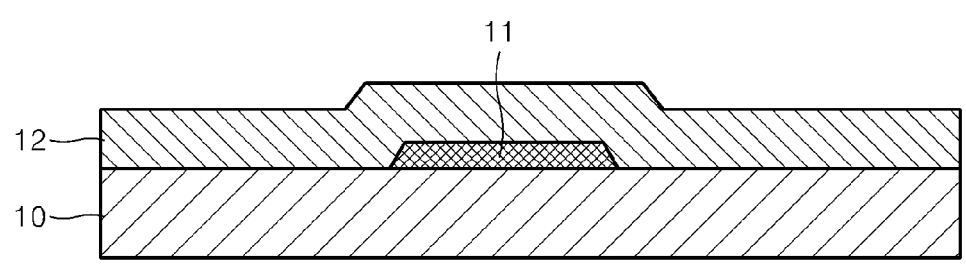

Referring to FIG. 2B, an insulating material may be coated on the substrate 10 and the gate 11 to form the gate insulating layer 12. The gate insulating layer 12 may be formed of SiO$_2$, HfO$_2$ (which is a higher-k material than SiO$_2$), Al$_2$O$_3$, Si$_3$N$_4$ or a combination thereof.

Figure 2C:
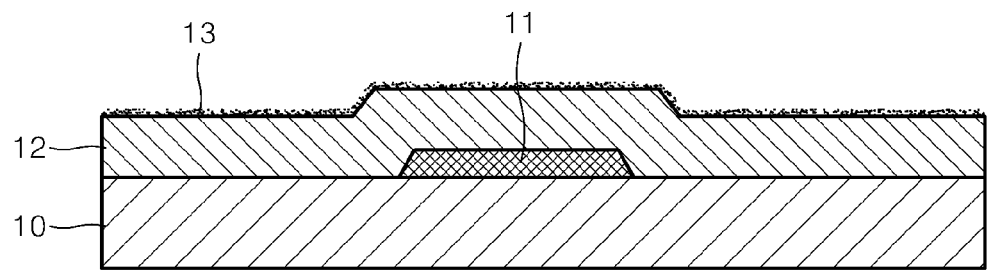

Referring to FIG. 2C, the metal material 13 may be deposited on the gate insulating layer 12. The metal material 13 may include Ni. Instead of Ni, the metal material 13 may include any metal that can form a silicon silicide (e.g., Ag, Au, Pd, Co, Cu, Fe, Al, Cr, Pt or combinations thereof). The metal material 13 may be deposited for the use in a subsequent process of crystallizing the channel 14. The metal material 13 may have a very (or substantially) low thickness of about 0.1 nm to 20 nm.

Figure 2D:
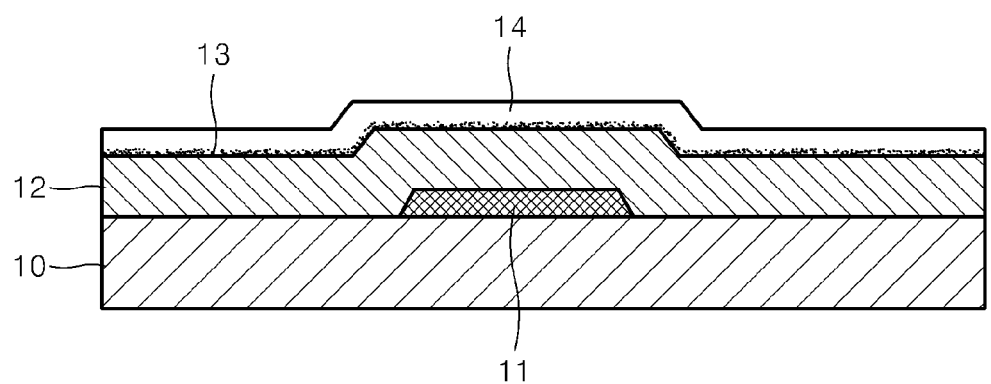

Referring to FIG. 2D, amorphous silicon may be coated on the metal material 13 and may be subjected to annealing to form the channel 14 made of polysilicon. During formation of the channel 14, the metal material 13 moves (or diffuses) to the surface of the channel 14 due to the annealing. The metal material 13 may simultaneously diffuse with the formation of the channel 14. If amorphous silicon is coated and the metal material 13 is subsequently deposited on a surface of the amorphous silicon and subjected to annealing to crystallize the amorphous silicon, the metal material 13 moves to the bottom of the channel 14 such that the metal material 13 concentrates on a space between the gate insulating layer 12 and the channel 14, increasing leakage current and off current. Because the method of FIGS. 2A through 2H deposits the metal material 13 before forming the channel 14, the metal material 13 concentrates on the surface of the channel 14 because the metal material 13 is diffused during the annealing for crystallization of the channel 14.

Figure 2E:
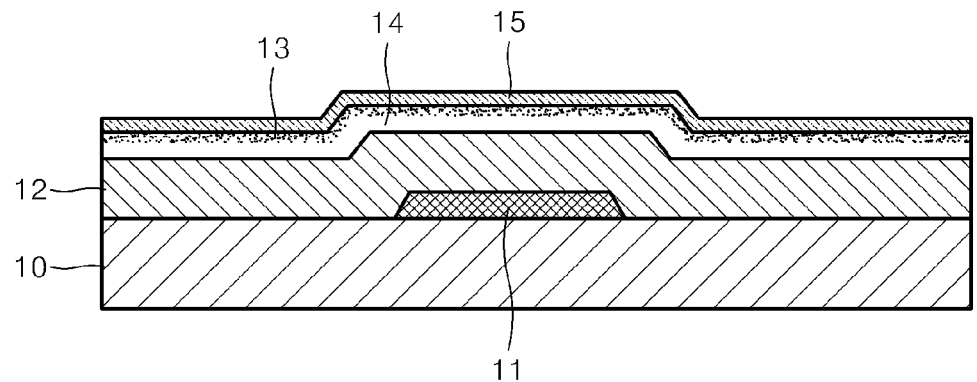

Referring to FIG. 2E, the intermediate layer 15 may be formed on the channel 14 in order to enable the channel 14 to contact the source 16a and the drain 16b. The intermediate layer 15 may be formed of n+ amorphous silicon.

Figure 2F:
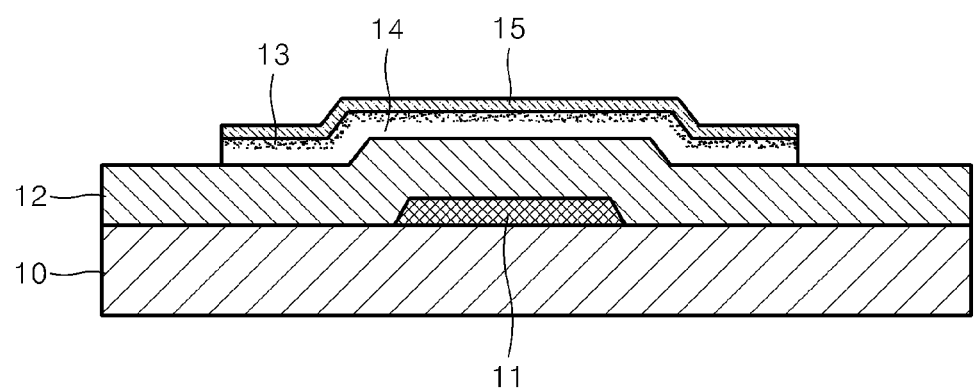
Figure 2G:
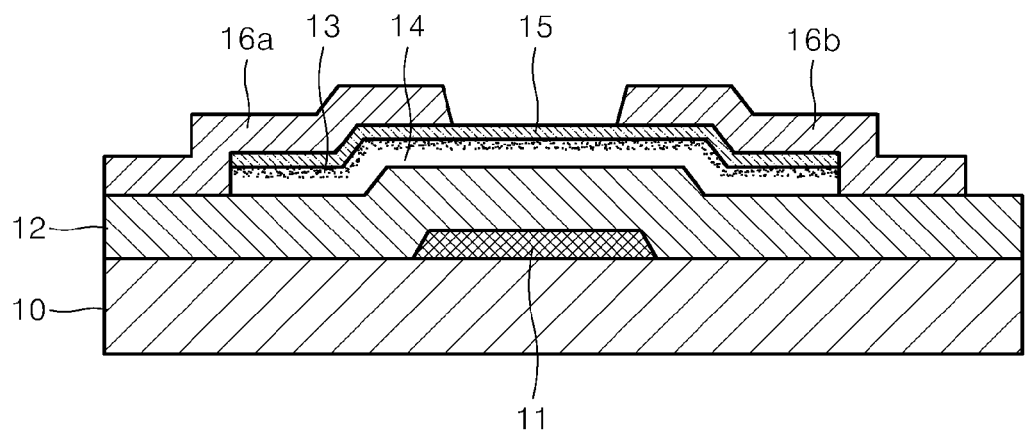
Figure 2H:
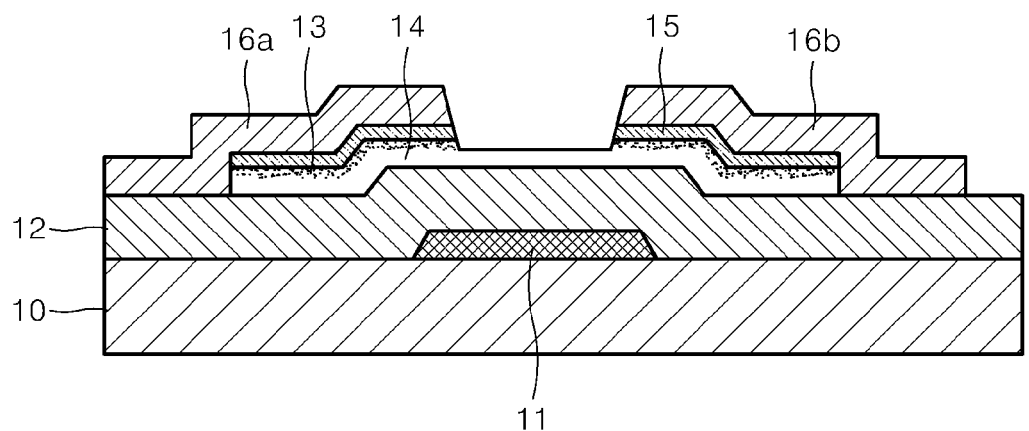

Referring to FIG. 2F, both (or opposing) sides of each of the channel 14 and the intermediate layer 15 may be removed by patterning. Referring to FIGS. 2G and 2H, a conductive material may be deposited on the channel 14 and the intermediate layer 15 and patterned until the channel 14 is exposed to form the source 16a and the drain 16b. During formation of the source 16a and the drain 16b, a part of the metal material 13 that diffuses into the surface of the channel 14 may be removed. Because a part of the metal material 13 that diffuses to an interface between the channel 14 and the source 16a and between the channel 14 and the drain 16b remains on the substrate 10, a contact resistance on the interface can be reduced.

The method of FIGS. 2A through 2H may be performed by chemical vapor deposition (CVD), physical vapor deposition (PVD) or atomic layer deposition (ALD).

According to example embodiments, various electronic devices such as a driving transistor for a flat panel display (e.g., an LCD or an OLED) using an oxide semiconductor and a transistor constituting a peripheral circuit of a memory device may be manufactured. While example embodiments have been particularly shown and described, it will be understood by one of ordinary skill in the art that various changes in form and details may be made therein without departing from the technical spirit and scope as defined by the following claims.

What is claimed is:
1. A method of manufacturing an oxide TFT, comprising:
    forming a gate on a substrate;
    forming a gate insulating layer on the substrate and the gate;
    depositing a metal material on the gate insulating layer;
    coating a channel material on the metal material;
    annealing the coated metal material such that a channel is formed;
    coating a conductive material on the channel; and
    etching the coated conductive material until a surface of the channel is exposed.

2. The method of claim 1, wherein the channel material is amorphous silicon.

3. The method of claim 1, further comprising forming an intermediate layer between the channel and a source and between the channel and a drain, wherein the intermediate layer reduces contact resistance between the channel and the source and between the channel and the drain.

4. The method of claim 1, wherein the metal material includes at least one selected from the group consisting of nickel (Ni), silver (Ag), gold (Au), palladium (Pd), cobalt (Co), copper (Cu), iron (Fe), aluminum (Al), chromium (Cr), platinum (Pt) and combinations thereof.

5. The method of claim 1, wherein the metal material has a thickness of about 0.1-nm to 20-nm.

6. The method of claim 1, wherein the channel is formed over the gate.

7. The method of claim 1, further comprising forming a source and a drain from the etched conductive material.

8. The method of claim 7, wherein the metal material diffuses to a surface of the channel during annealing of the coated metal material.

9. The method of claim 8, further comprising removing the surface of the channel between the source and the drain.

10. A method of manufacturing an oxide TFT, comprising:
    forming a gate on a substrate;
    forming a gate insulating layer on the substrate and the gate;
    depositing a metal material on the gate insulating layer;
    coating a channel material on the metal material;
    forming a channel from the channel material, wherein the metal material diffuses to an upper surface of the channel;
    coating a conductive material on the channel; and
    etching the coated conductive material until the upper surface of the channel is exposed.

11. The method of claim 10, wherein the metal material crystallizes the channel.

12. The method of claim 10, forming the channel includes annealing the channel material.

* * * * *